(12) United States Patent
Renn

(10) Patent No.: US 8,420,411 B2
(45) Date of Patent: Apr. 16, 2013

(54) METHOD FOR ALIGNING WAFER STACK

(75) Inventor: Shing-Hwa Renn, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/326,330

(22) Filed: Dec. 15, 2011

(65) Prior Publication Data

US 2012/0083053 A1 Apr. 5, 2012

Related U.S. Application Data

(62) Division of application No. 12/756,193, filed on Apr. 8, 2010, now Pat. No. 8,102,064.

(51) Int. Cl.
*H01L 21/00* (2006.01)
(52) U.S. Cl.
USPC ............... 438/11; 438/18; 438/401; 438/975
(58) Field of Classification Search .................. 438/5, 6, 438/10, 11, 14, 17, 18, 401, 975
See application file for complete search history.

(56) References Cited

U.S. PATENT DOCUMENTS

| | | | |
|---|---|---|---|
| 6,391,669 B1 * | 5/2002 | Fasano et al. | 438/18 |
| 6,518,679 B2 | 2/2003 | Lu | |
| 6,925,411 B1 | 8/2005 | Drost | |
| 2006/0202359 A1 | 9/2006 | Chen | |
| 2011/0050320 A1 | 3/2011 | Gillingham | |
| 2011/0156284 A1 * | 6/2011 | Zhang et al. | 257/797 |

* cited by examiner

*Primary Examiner* — Fernando L Toledo
*Assistant Examiner* — Bryan Junge
(74) *Attorney, Agent, or Firm* — Winston Hsu; Scott Margo

(57) ABSTRACT

A method for aligning a wafer stack includes providing a wafer stack including a top wafer with a top mark and a bottom wafer with a bottom mark in particular the top mark and the bottom mark capable of corresponding to each other; adjusting a relative position between the top wafer and the bottom wafer so that the top mark and the bottom mark are in contact with each other; applying an electrical signal on the top mark to obtain an electrical reading and optimizing the electrical reading to substantially align the wafer stack.

9 Claims, 4 Drawing Sheets

METHOD FOR ALIGNING WAFER STACK

CROSS REFERENCE TO RELATED APPLICATIONS

This application is a divisional application of and claims the benefit of U.S. patent application Ser. No. 12/756,193, filed Apr. 8, 2010.

BACKGROUND OF THE INVENTION

1. Field of the Invention

The present invention generally relates to a method for aligning a wafer stack. In particular, the present invention is directed to a method for aligning a wafer stack for the detection of the relative position of multiple objects by optimizing an adjustable current path.

2. Description of the Prior Art

Lithographic technologies are key technologies that affect the critical dimensions in semiconductor processes. Generally speaking, electric circuit patterns are formed by first transferring the patterns from a photo mask to a photoresist layer in a lithographic process, and then transferring the patterns from the photoresist layer to an underlying material layer such as a dielectric layer or a metal layer in a subsequent etching process. Thus, several marks are required to be disposed on the wafer or the underlying material layers to increase alignment accuracy between layers.

In order to increase production yield, alignment and overlay marks are typically provided on a wafer or material layers. By way of example, a sample wafer with alignment marks is put into product lines for testing alignment accuracy before wafers are practically in mass production. In the lithography process, the photo mask and the wafer are first aligned by an exposure tool using a set of pre-layer alignment marks and current-layer alignment marks typically located near an edge or on a scribe line of the wafer surface. Then, the exposure tool detects the pre-layer alignment marks and current-layer alignment marks and the reflected light signal is analyzed by the exposure tool to obtain the required precise alignment prior to the actual exposure process. The alignment marks typically includes a set of trenches which are etched into a material layer on a wafer.

On one hand, "pre-layer" may refer to a material layer or a wafer processed in a previous step. On the other hand, "current-layer" may refer to another material layer or another wafer which is to be processed in the current process.

After exposure, the photoresist layer on the wafer is then subjected to development process to form a photoresist pattern. Before implementing the etching process for transferring the photoresist pattern into the underlying material layer, it is important to check if the electric circuit features which are defined in the developed photoresist layer perfectly match with the electric circuit patterns which are previously formed on the wafer; otherwise, the previously formed electric circuit may fail. Therefore, accuracy of the alignment has to be checked. Then, offset distances between the pre-layer mark and the current-layer mark can be measured by a tool, and the exposure parameters and development parameters can be adjusted.

However, the above-described prior art has some fatal applicable drawbacks. First, since the alignment mark or the overlay mark is detected by devices such as an exposure tool or an overlay tool, the alignment mark or the overlay mark therefore are sort of "optical marks" and they must be large enough or plenty enough to be practical. As known in this art, the surface of a wafer is getting more and more scarce due to the demanding shrinkage of the critical dimension of the semiconductor elements so there is less and less space left for the over-sized alignment marks or the overlay marks.

Second, since the alignment marks and the overlay marks are optical marks, they can only be useful in transparent or semi-transparent conditions. Moreover, supposing there are too many layers stacking on one another, as a result, both the alignment marks and the overlay marks become too weak to be detected, in particular, when the substrates or the layers to be aligned with one another are not transparent at all, i.e. opaque. Accordingly, a novel alignment mark or overlay mark is still needed to overcome these restrictive problems.

SUMMARY OF THE INVENTION

Given the above, the present invention as a result proposes a novel electrical alignment mark set to replace the traditional optical alignment mark set. The novel electrical alignment mark set of the present invention is particular useful in the detection of the relative position among multiple stacked objects, such as a wafer stack.

The electrical alignment mark set of the present invention includes a top mark, a bottom mark and at least one optional middle mark. The top mark is disposed on a top wafer and includes multiple pads, such as a first pad, a second pad, a third pad and a fourth pad. The top mark also includes at least one monitoring via which is disposed in the top wafer and electrically connected to the first pad and to the second pad.

The bottom mark is disposed on a bottom wafer and includes a first bottom pad and a second bottom pad which are electrically connected to each other. In one aspect, the first bottom pad corresponds to the monitoring via. In another aspect, the second bottom pad corresponds to the third pad and to the fourth pad so that the monitoring via is capable of being simultaneously electrically connected to the third pad and to the fourth pad by means of the first bottom pad as well as the second bottom pad when the top mark and the bottom mark are aligned with each other.

The optional middle mark is disposed on at least one middle wafer and includes a middle monitoring via, a first middle via and a second middle via. The middle monitoring via respectively corresponds to the monitoring via and the first bottom pad. The first middle via respectively corresponds to the second bottom pad and the third pad. The second middle via respectively corresponds to the second bottom pad and the fourth pad so that the monitoring via is capable of being simultaneously electrically connected to the third pad and to the fourth pad by means of the middle mark when the top mark, the middle mark and the bottom mark are simultaneously aligned with one another.

The present invention also proposes a method for using an electrical alignment mark set. First, a wafer stack is provided. The wafer stack includes a top wafer with a top mark and a bottom wafer with a bottom mark. The top mark and the bottom mark are capable of corresponding to each other. Second, a relative position between the top wafer and the bottom wafer is so adjusted that the top mark and the bottom mark are substantially in contact with each other. Then, an electrical signal is applied on the top mark to obtain an electrical reading. Afterwards, the electrical reading is optimized in order to substantially align the wafer stack. Preferably, the electrical reading is gradually optimized by reference to a database in order to substantially align the wafer stack. In another aspect, the method of the present invention may also be used in determining if a wafer stack suffers a yield problem or a poor alignment.

The feature of the present invention at least lies in using the alignment mark to measure the electrical readings between the previous layer and the current layer. Furthermore, the measurement is performed electrically rather than optically. In other words, the novel electrical alignment mark set of the present invention is still useful even if the substrates to be aligned with are non-transparent or too many. Last but not the least, the novel electrical alignment mark set of the present invention is much smaller than the traditional alignment marks so more space may be available for the semiconductor elements.

These and other objectives of the present invention will no doubt become obvious to those of ordinary skill in the art after reading the following detailed description of the preferred embodiment that is illustrated in the various figures and drawings.

DETAILED DESCRIPTION

The present invention as a result provides a novel electrical alignment mark set to replace the traditional optical alignment marks and to solve the problems which the traditional optical alignment marks suffer. The novel electrical alignment mark set of the present invention is particularly useful in the alignment of the wafer stack in Through-Silicon Via (TSV) technology.

The present invention first provides an electrical alignment mark set. The electrical alignment mark set of the present invention may serve as an alignment mark or an overlay mark for the alignment of two different layers or two different substrate, such as for use in a wafer stack.

Figure 1:
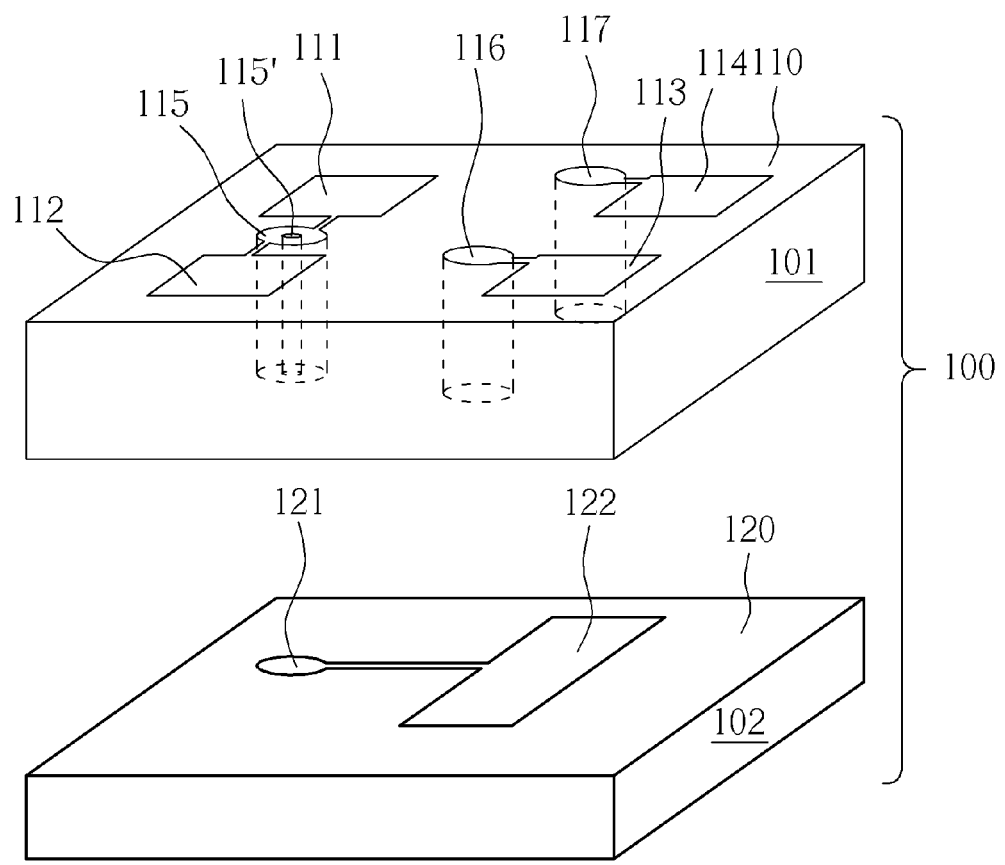
FIG. 1 illustrates a perspective view of one embodiment of the electrical alignment mark set of the present invention.

FIG. 1 illustrates a perspective view of the electrical alignment mark set of the present invention. In the drawings of the present invention, some elements may not be shown for the convenience of illustrations. The electrical alignment mark set 100 of the present invention includes at least a top mark 110 on or in a top wafer 101 and a bottom mark 120 on or in a bottom wafer 102.

As shown in FIG. 1, the top mark 110 may includes multiple pads such as probing pads, for example a first pad 111, a second pad 112, a third pad 113 and a fourth pad 114, for example, but the pads are not limited to only four pads and more pads are possible. The multiple pads are disposed on a top wafer 101. In addition, the top mark 110 further includes at least one monitoring via 115. The monitoring via 115 is disposed in the top wafer 101 and electrically connected to the first pad 111 and to the second pad 112. In addition, there are connecting vias 116 and 117 electrically connected to the third pad 113 and to the fourth pad 114 respectively.

The top wafer 111 may be one of the wafers in a wafer stack using the Through-Silicon Via (TSV) technology. Accordingly, the monitoring via 115 as well as the connecting vias 116 and 117 may respectively be an electrical-conductive via made by the Through-Silicon Via (TSV) technology. Optionally, there may be more than one monitoring vias 115. The shape as well as the size of the monitoring via 115 may be specially designed for the facilitation of the optimization of the alignment. In one embodiment of the present invention, the monitoring via 115 may optionally encompass a non-conductive via 115' within, as shown in FIG. 1.

For example, on one hand the size of the pads may not greater than 70 μm one side and the diameter of the monitoring via 115 may be 15 μm-50 μm to occupy less space on the top wafer 101. Please notice that, the size of the connecting vias 116 and 117 may be larger than that of the monitoring via 115 providing the monitoring via 115 is the main mark for the alignment. Optionally, on the other hand the monitoring via 115 and the connecting vias 116 and 117 may be disposed among the multiple pads for the optimal arrangement of the top mark 110.

Please refer to FIG. 1, the bottom mark 120 is disposed on the bottom wafer 102 and is situated corresponding to the top mark 110. The bottom mark 120 includes a first bottom pad 121 and a second bottom pad 122 which are electrically connected to each other. As far as the first bottom pad 121 is concerned, the first bottom pad 121 on the bottom wafer 102 exclusively corresponds to the monitoring via 115 in the top wafer 101 in most aspects, such as in shape, in size and in position. The second bottom pad 122 roughly corresponds to the third pad 113 and to the fourth pad 114 through the connecting vias 116 and 117. However, the second bottom pad 122 is not required to strictly correspond to the connecting vias 116 and 117 in most aspects. In other words, it is sufficient as long as the surface area of the second bottom pad 122 is large enough or much larger to be able to be in direct contact with both the connecting vias 116 and 117 as much as possible, or preferably, completely in contact with both the connecting vias 116 and 117. The connecting vias 116 and 117 may also be electrical-conductive vias made by the Through-Silicon Via (TSV) technology.

In one preferred embodiment of the present invention, the monitoring via 115, the connecting vias 116 and 117, the first bottom pad 121 and the second bottom pad 122 are so arranged that the monitoring via 115 which is previously not electrically connected to the third pad 113 and to the fourth pad 114 would be consequently capable of being simultaneously electrically connected to the third pad 113 and to the fourth pad 114 by means of the first bottom pad 121, the second bottom pad 122 and the connecting vias 116 and 117 when the top mark 110 and the bottom mark 120 are aligned with each other. In other words, because the monitoring via 115 has already been electrically connected to the first pad 111 and to the second pad 112, the first bottom pad 121 has already been electrically connected to the second bottom pad 122, and the connecting vias 116 and 117 have already been electrically connected to the third pad 113 and to the fourth pad 114 in advance, a conductive path is substantially formed from the first pad 111 and the second pad 112 to the third pad 113 and the fourth pad 114 through the monitoring via 115, the first bottom pad 121, the second bottom pad 122 and the connecting vias 116 and 117 only when the top mark 110 and the bottom mark 120 are substantially aligned with each other.

Figure 2:
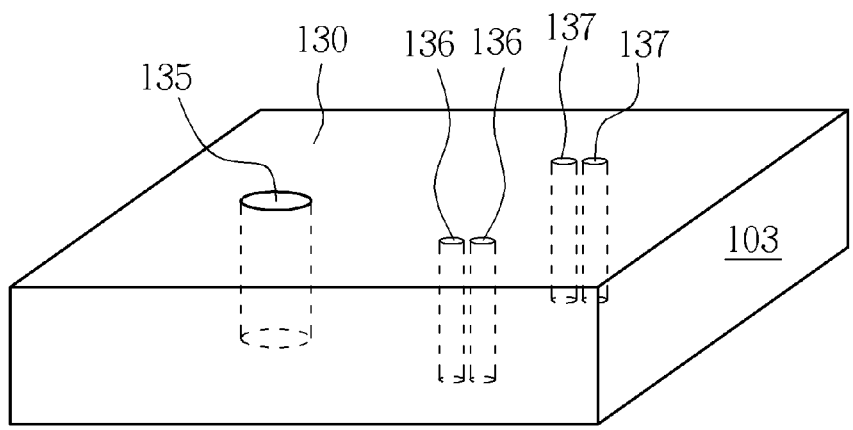
FIG. 2 illustrates a perspective view of another embodiment of the electrical alignment mark set of the present invention.

The electrical alignment mark set 101 of the present invention may further include at least one optional middle mark 130. FIG. 2 illustrates a perspective view of the electrical alignment mark set with one middle mark 130 of the present invention. The middle mark 130 is disposed on an optional middle wafer 103 and includes at least a middle monitoring via 135, a first middle via 136 and a second middle via 137. There may be more than one middle wafer 130 to form a wafer stack. The middle monitoring via 135 on the middle wafer 130 is particular designed, for example in shape, in size and in position for the facilitation of the optimization of the alignment, to exclusively and respectively correspond to the monitoring via 115 and to the first bottom pad 121, just like the monitoring via 115 corresponding to the first bottom pad 121.

In addition, the first middle via 136 as well as the second middle via 137 may roughly correspond to the second bottom pad 122 and the third pad 113. As described earlier, the middle monitoring via 135, the first middle via 136 and the second middle via 137 may respectively be an electrical-conductive via made by the Through-Silicon Via (TSV) technology. Please notice that at least one of the middle monitoring via 135, the first middle via 136 and the second middle via 137 may have multiple conductive channels.

In other words, the middle monitoring via 135, the first middle via 136 and the second middle via 137 are so arranged and designed so that a conductive path is substantially formed from the first pad 111 and the second pad 112 to the third pad 113 and the fourth pad 114 through the monitoring via 115, the middle monitoring via 135, the first bottom pad 121, the second bottom pad 122, the first middle via 136, the second middle via 137 and the connecting vias 116 and 117 only when the top mark 110, the middle mark 130 and the bottom mark 120 are substantially aligned with one another.

The present invention also provides a method for aligning a wafer stack. The advantageous features of the method of the present invention reside in using electrical in stead of optical properties to align substrates or wafers in stack. With the advantageous features, the substrates to be aligned with do not have to be transparent or semi-transparent. Besides, theoretically speaking no matter how many layers are present in a wafer stack, the present invention is still useful in aligning the wafer stack.

Figure 3A:
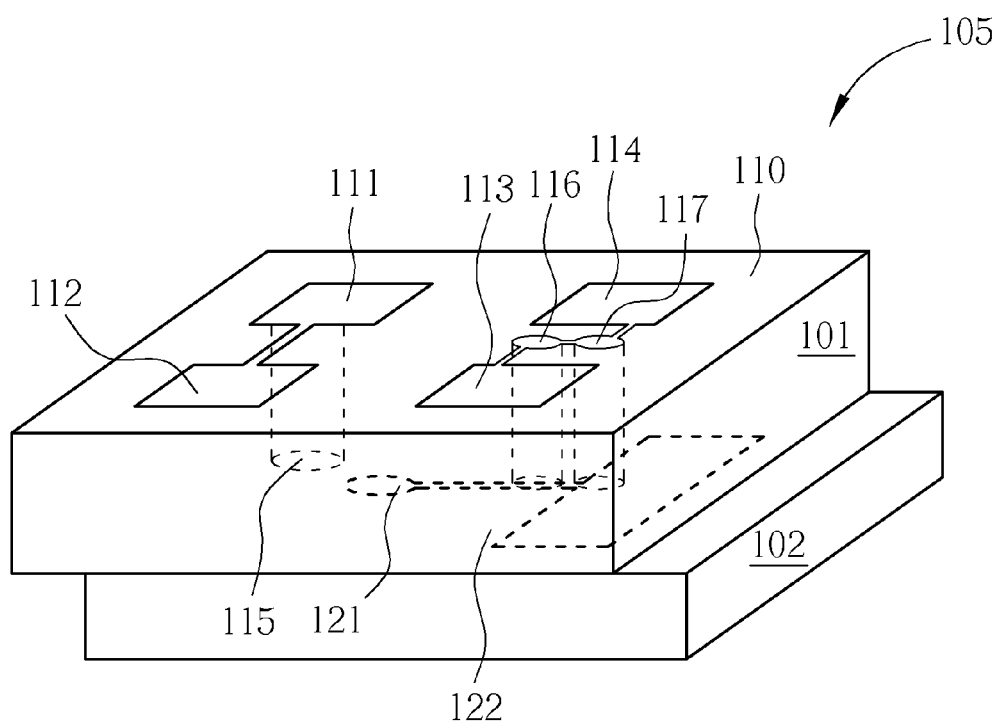
FIGS. 3-5 illustrate the method for aligning a wafer stack of the present invention.
Figure 4A:
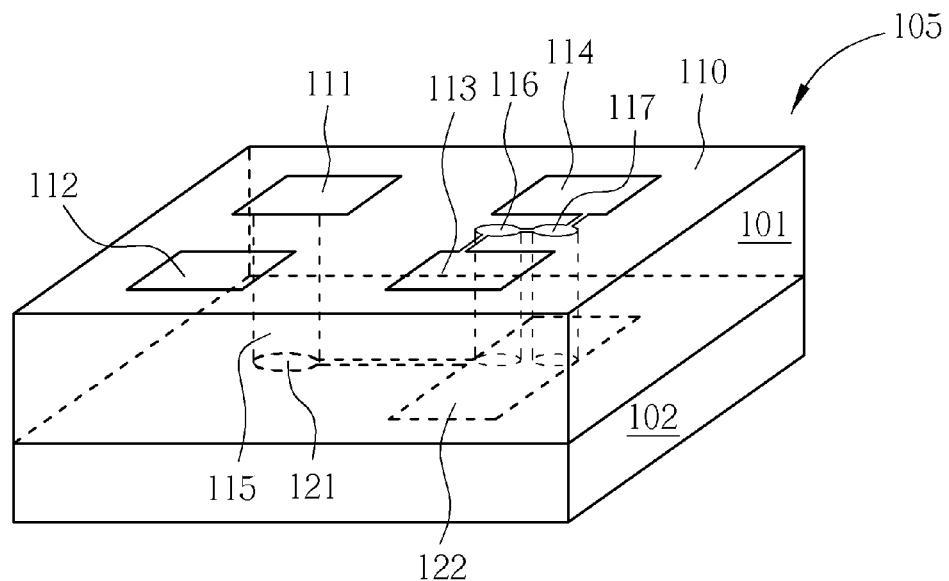
Figure 4B:
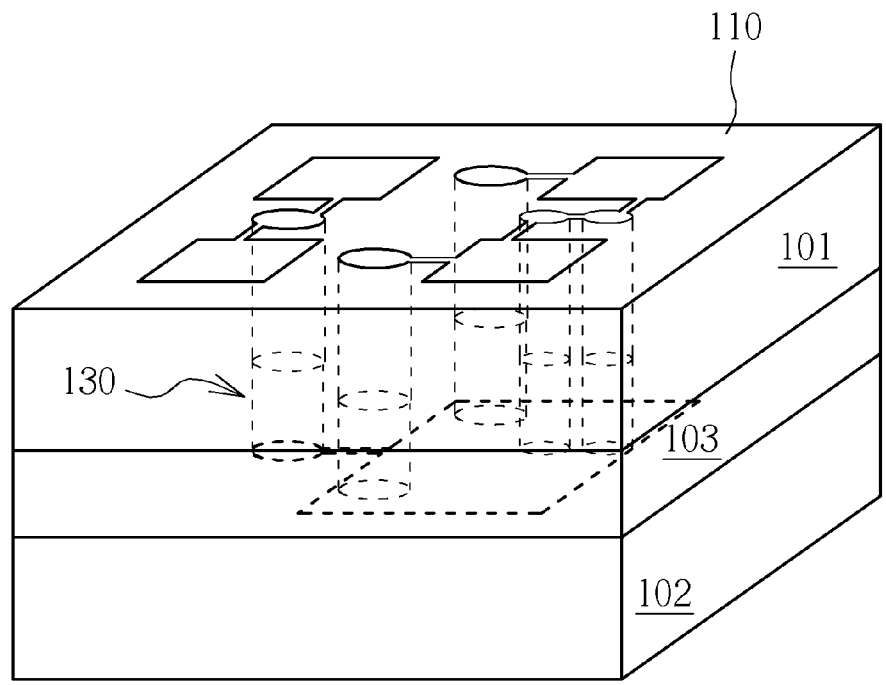
Figure 5:
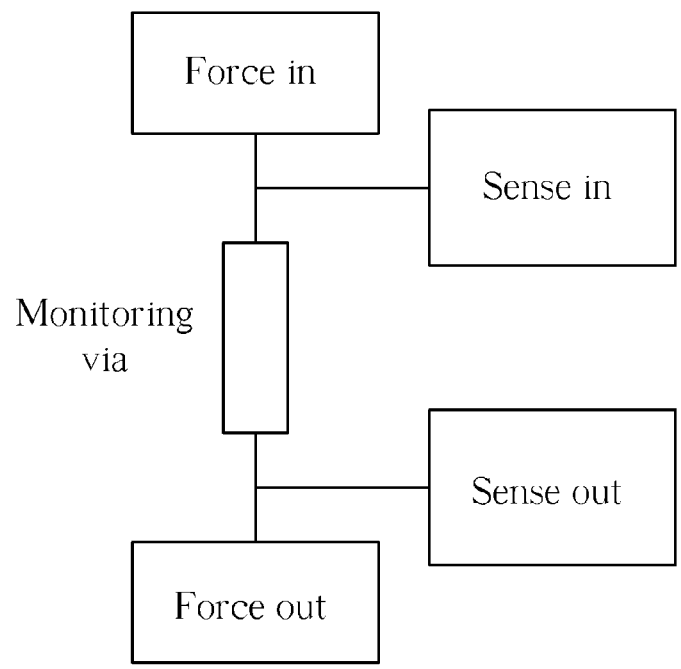

FIGS. 3-5 illustrate the method for aligning a wafer stack of the present invention. As shown in FIG. 3A, a wafer stack 105 is provided. The wafer stack 105 includes an alignment mark set 100. The alignment mark set 100 includes at least a top mark 110 on a top wafer 101 and a bottom mark 120 on a bottom wafer 102. The top mark 110 and the bottom mark 120 correspond to each other.

Figure 3B:
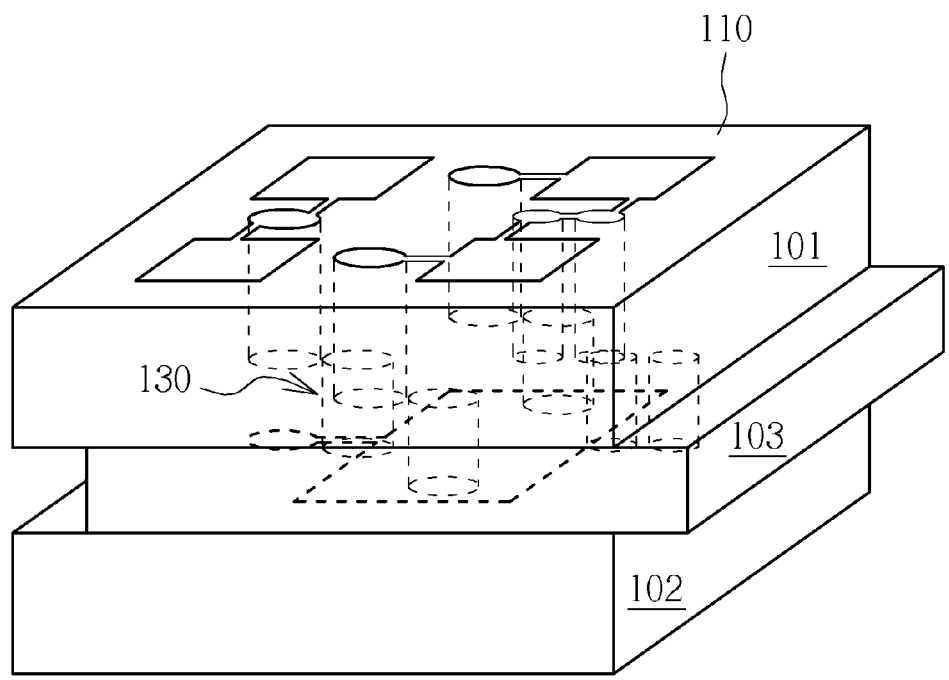
Figure 3C:
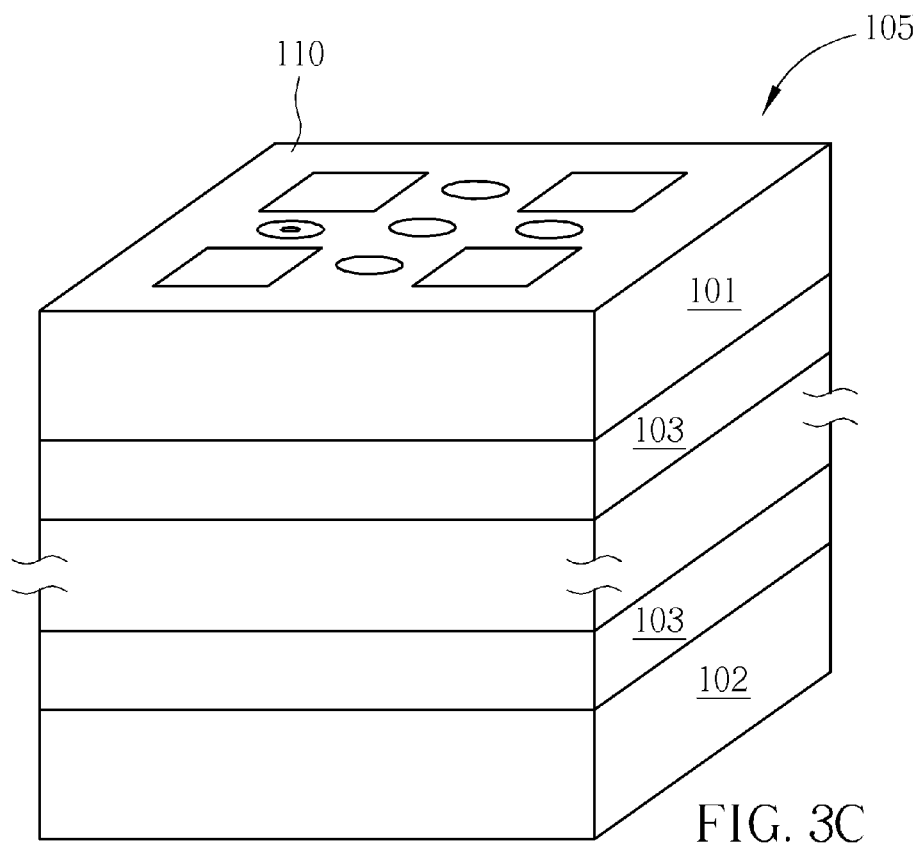

The wafer stack 105 of the present invention may further include at least one optional middle wafer 103. FIG. 3B illustrates a perspective view of a wafer stack with one middle wafer of the present invention. FIG. 3C illustrates a perspective view of a wafer stack with multiple middle wafers of the present invention. Some elements are not shown for the reason of simplicity. There is a middle mark 130 in each one of the middle wafer 103. Please refer to the above-mentioned descriptions for the details of the alignment mark set 100, the top mark 110, the top wafer 101, the bottom mark 120, the bottom wafer 102, the middle marks 130 and the middle wafers 103.

Second, please refer to FIG. 4A, a relative position between the top wafer 101 and the bottom wafer 102 is so adjusted that the top mark 110 and the bottom mark 120 are accordingly in contact with each other. If at least one middle wafer 103 is present in the wafer stack 105, a relative position between the top wafer 101 and the middle wafer 103 as well as a relative position between the middle wafer 103 and bottom wafer 102 are so respectively adjusted that the top mark 110, the middle mark 130 and the bottom mark 120 are accordingly in contact with one another. FIG. 4B illustrates a perspective view of a middle wafer present in a wafer stack of the present invention.

Next, please refer to FIG. 5. FIG. 5 illustrates a simplified circuit of the present invention. The present invention may employ a standard 4-point measurement structure. The first pad 111, the second pad 112, the third pad 113 and the fourth pad constitute the four pads in the standard 4-point measurement structure, namely "Force-In," "Force-Out," "Sense-In" and "Sense-Out."

To start with, an electrical signal is applied on one of the pads serving as "Force-In" on the top mark 110 to obtain an electrical reading from another one of the pads serving as "Sense-Out." The electrical signal may be any useful electrical signal such as a current and/or a voltage. The electrical reading may be any useful electrical property such as an electrical resistance and/or a current. If there is no electrical reading which can be obtained, this result suggests that the wafer stack 105 may be in extremely poor alignment so there is no electric path can be reached.

Then, please refer to FIG. 3A, FIG. 3B, FIG. 3C, FIG. 4A and FIG. 4B, the electrical readings should be optimized to substantially obtain an optimal electrical reading as expected. An optimal electrical reading may suggest that the entire wafer stack is in perfect alignment. The principle of the method for aligning the wafer stack of the present invention relies on that an optimal electrical reading can be obtained once a perfect electric path is constructed through the monitoring via 115, the optional middle monitoring via 135 and the first bottom pad 121 only when the entire wafer stack is in perfect alignment. Since the monitoring via 115 on the top wafer 101, the middle monitoring via 135 on the optional middle wafer 103 and the first bottom pad 121 on the bottom wafer 103 are so designed to match and to correspond to one another, the strongest, i.e. the optimal electrical reading can be obtained only when the entire wafer stack is in perfect alignment.

For example, if the monitoring via 115, the optional middle monitoring via 135 and the first bottom pad 121 are made of copper, the electrical resistance within the 4-point measurement structure reach its minimal only when the direct contact area among the electrical alignment mark set reach its maximal. It is understood that the direct contact area among the electrical alignment mark set can reach its maximal only when the entire wafer stack is in perfect alignment.

In another embodiment of the present invention, at least one of the monitoring via 115, the optional middle monitoring via 135 and the first bottom pad 121 may have multiple channels so that alignment in multiple directions can be reached.

However, process defects, namely yield problems rather than poor alignment may result in poor electrical reading, too. In one aspect, at least one wafer in the wafer stack is considered to suffer a yield problem when the electrical readings are not capable of being optimized by adjusting the relative position within the wafer stack. In another aspect, the wafer stack may be excluded from a yield problem when the electrical readings are capable of being optimized by adjusting the relative position within the wafer stack. In other words, the method of the present invention may also be used in determining if a wafer stack suffers a yield problem or a poor alignment.

For the mass production, a database for calibrating the optimal electrical readings may be constructed in advance to facilitate the method for aligning a wafer stack. The database can be used to determine if a good alignment is reached when different electrical readings are obtained. The procedures to construct the database are known by persons of ordinary skills in the art and details will not be discussed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for aligning a wafer stack, comprising:
providing a wafer stack comprising a top wafer with a top mark and a bottom wafer with a bottom mark, wherein said top mark and said bottom mark are capable of corresponding to each other, wherein said top mark comprises a first pad, a second pad, a third pad and a fourth pad which are disposed on said top wafer and comprises at least one monitoring via which is disposed in said top wafer and electrically connected to said first pad and to said second pad, and said bottom mark comprises a first bottom pad and a second bottom pad which are electrically connected to each other, wherein said first bottom pad corresponds to said monitoring via and said second bottom pad corresponds to said third pad and to said fourth pad so that said monitoring via is capable of being simultaneously electrically connected to said third pad and to said fourth pad by means of said first bottom pad to obtain said electrical reading when said top mark and said bottom mark are aligned with each other;
adjusting a relative position between said top wafer and said bottom wafer so that said top mark and said bottom mark are in direct contact with each other;
applying an electrical signal on said top mark to obtain an electrical reading; and
optimizing said electrical reading to substantially align said wafer stack.

2. The method for aligning a wafer stack of claim 1, wherein said first bottom pad corresponds to said monitoring via in shape.

3. The method for aligning a wafer stack of claim 1, further comprising:
providing at least one middle wafer with a middle mark comprising a middle monitoring via, a first middle via and a second middle via, wherein said middle monitoring via respectively corresponds to said monitoring via and said first bottom pad, said first middle via respectively corresponds to said second bottom pad and said third pad, and said second middle via respectively corresponds to said second bottom pad and said fourth pad so that said monitoring via is capable of being electrically connected to said third pad and to said fourth pad by means of said at least one middle mark to obtain said electrical reading when said top mark, said middle mark and said bottom mark are aligned with one another; and
adjusting a relative position among said top wafer, said at least one middle wafer and said bottom wafer so that said top mark, said middle mark and said bottom mark are in contact with one another.

4. The method for aligning a wafer stack of claim 1, further comprising:
determining at least one wafer in said wafer stack suffering a yield problem when said electrical reading is not capable of being optimized by adjusting the relative position within said wafer stack.

5. The method for aligning a wafer stack of claim 1, further comprising:
excluding said wafer stack from a yield problem when said electrical reading is capable of being optimized by adjusting the relative position within said wafer stack.

6. The method for aligning a wafer stack of claim 1, wherein said electrical signal is at least one of a current and a voltage.

7. The method for aligning a wafer stack of claim 1, wherein said electrical reading is at least one of an electrical resistance and a current.

8. The method for aligning a wafer stack of claim 1, wherein there are a plurality of middle wafers in said wafer stack.

9. The method for aligning a wafer stack of claim 1, wherein said wafer stack comprises a through-silicon via.

* * * * *